(12) United States Patent
Qian et al.

(10) Patent No.: US 11,759,823 B2
(45) Date of Patent: Sep. 19, 2023

(54) PIEZOELECTRIC MICROMACHINED ULTRASONIC TRANSDUCER AND METHOD OF FABRICATING THE SAME

(71) Applicant: Vanguard International Semiconductor Corporation, Hsinchu (TW)

(72) Inventors: You Qian, Singapore (SG); Rakesh Kumar, Singapore (SG); Jia Jie Xia, Singapore (SG)

(73) Assignee: Vanguard International Semiconductor Corporation, Hsinchu (TW)

( * ) Notice: Subject to any disclaimer, the term of this patent is extended or adjusted under 35 U.S.C. 154(b) by 647 days.

(21) Appl. No.: 16/936,452

(22) Filed: Jul. 23, 2020

(65) Prior Publication Data
US 2022/0023915 A1    Jan. 27, 2022

(51) Int. Cl.
   *B06B 1/06*     (2006.01)
   *B81B 3/00*     (2006.01)
   *B81C 1/00*     (2006.01)

(52) U.S. Cl.
   CPC ......... *B06B 1/0666* (2013.01); *B81B 3/0021* (2013.01); *B81C 1/00158* (2013.01); *B81B 2201/0271* (2013.01); *B81B 2203/0127* (2013.01); *B81B 2203/0307* (2013.01); *B81B 2203/04* (2013.01); *B81C 2201/0109* (2013.01)

(58) Field of Classification Search
   CPC ....... B06B 1/06; B06B 1/0666; H01L 41/053; H10N 30/88
   USPC .................................................. 310/322, 334
   See application file for complete search history.

(56) References Cited

U.S. PATENT DOCUMENTS

2005/0184627 A1    8/2005  Sano

*Primary Examiner* — Derek J Rosenau
(74) *Attorney, Agent, or Firm* — Winston Hsu

(57) ABSTRACT

A PMUT includes a substrate, a membrane, and a sacrificial layer. The substrate has a cavity penetrating the substrate. The membrane is disposed over the cavity and includes a first piezoelectric layer, a bottom electrode, a top electrode, and a second piezoelectric layer. The first piezoelectric layer is disposed over the cavity and includes an anchor portion, where the anchor portion of the first piezoelectric layer is in direct contact with the substrate. The top and bottom electrodes are disposed over the first piezoelectric layer. The second piezoelectric layer is disposed between the bottom electrode and the top electrode. The sacrificial layer is disposed between the substrate and the first piezoelectric layer, and a vertical projection of the sacrificial layer does not overlap a vertical projection of portions of the membrane disposed over the cavity.

10 Claims, 7 Drawing Sheets

PIEZOELECTRIC MICROMACHINED ULTRASONIC TRANSDUCER AND METHOD OF FABRICATING THE SAME

BACKGROUND OF THE INVENTION

1. Field of the Invention

The present disclosure relates generally to the field of Micro Electro Mechanical Systems (MEMS), and more particularly to a piezoelectric micromachined ultrasonic transducer (PMUT) and a method of fabricating the same.

2. Description of the Prior Art

For the past few decades, micromachined ultrasonic transducers (MUTs) have been subject to extensive research and become an important component in various consumer electronics, such as fingerprint, proximity and gesture sensing. In general, MUTs could be categorized into two major types, capacitive micromachined ultrasonic transducers (CMUTs) or piezoelectric micromachined ultrasonic transducers (PMUTs). For a typical PMUT, the PMUT has a membrane consisting of elastic material, electrodes and piezoelectric material, and the membrane is disposed over a cavity acting as an acoustic resonator to improve acoustic performance of the PMUT. During the operation of the PMUT, an ultrasound wave generated by vibrating the membrane is transmitted from the PMUT to a target, and then the reflected wave generating after hitting the object could be detected by the PMUT.

Generally, PMUTs typically operate at the membrane's flexural resonant frequency, which is defined by selecting the correct materials, membrane size, and thickness. Thus, good matching of the resonant frequencies of the individual PMUTs is required for proper operation. For a conventional PMUT, in order to adjust the membrane's flexural resonant frequency, the membrane disposed over the cavity often incudes an elastic layer with required elasticity at the bottom of the membrane, and electrodes and piezoelectric layer of the membrane are often disposed on the elastic layer. However, since the quality of the piezoelectric layer in the membrane is very sensitive to the surface texture of the underlying layer (such as the elastic layer), there are many restrictions on the material of the elastic layer as well as on the processes for forming the elastic layer. Therefore, the resonant frequencies of the PMUTs could not be adjusted freely even though the membrane could be fabricated to include the elastic layer.

Accordingly, there is a need to provide an improved PMUT and a method of fabricating the same in order to solve the problems in current PMUTs.

SUMMARY OF THE INVENTION

In view of this, it is necessary to provide an improved PMUT and a method of fabricating the same which allow the elasticity of the membrane of the PMUT to be adjusted freely.

According to one embodiment of the present disclosure, a PMUT includes a substrate, a membrane, and a sacrificial layer. The substrate has a cavity penetrating the substrate. The membrane is disposed over the cavity and includes a first piezoelectric layer, a bottom electrode, a top electrode, and a second piezoelectric layer. The first piezoelectric layer is disposed over the cavity and includes an anchor portion, where the anchor portion of the first piezoelectric layer is in direct contact with the substrate. The bottom electrode is disposed over the first piezoelectric layer. The top electrode is disposed over the bottom electrode. The second piezoelectric layer is disposed between the bottom electrode and the top electrode. The sacrificial layer is disposed between the substrate and the first piezoelectric layer, where a vertical projection of the sacrificial layer is not overlapped with a vertical projection of portions of the membrane disposed over the cavity.

According to another embodiment of the present disclosure, a method of fabricating a PMUT is disclosed and includes the following steps. First, a substrate is provided, and a sacrificial layer is formed on the substrate, where the sacrificial layer comprises at least one hole exposing the substrate. Then, a piezoelectric layer is formed in the at least one hole and on the sacrificial layer. A cavity penetrating the substrate is formed to expose portions of the sacrificial layer. Afterward, the portions of the sacrificial layer exposed from the cavity are removed using the piezoelectric layer as an etch stop structure.

According to the embodiments of the present disclosure, the elastic layer is not disposed between the substrate and the membrane, but disposed at the upper portion of the membrane. Therefore, the crystallinity of the piezoelectric layer in the membrane would no longer be affected by the elastic layer, which allows the free adjustment to the elasticity of the membrane of the PMUT.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
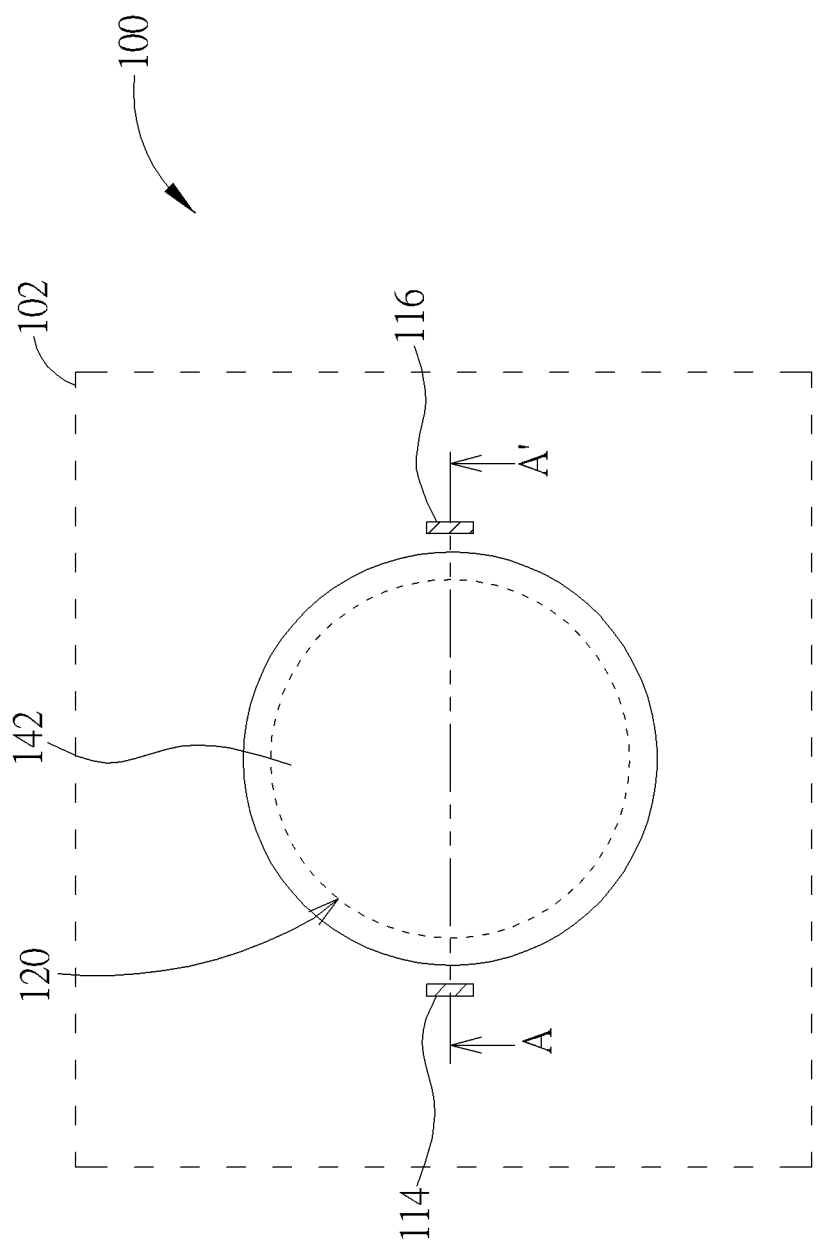
FIG. 1 is a schematic top view of a piezoelectric micromachined ultrasonic transducer (PMUT) in accordance with one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed indirect contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

It is understood that the specific order or hierarchy of blocks in the following disclosed processes/flowcharts is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the presented specific order or hierarchy.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

FIG. 1 is a schematic top view of a piezoelectric micromachined ultrasonic transducer (PMUT) in accordance with one embodiment of the present disclosure. Referring to FIG. 1, a PMUT 100 includes at least a substrate 102, a cavity 120 formed through the substrate 102, a stopper (not shown) disposed along the opening of the cavity 120, a membrane (not shown), such as a multi-layered structure, disposed on the cavity 120, and an elastic layer 142 disposed on the membrane and separated from the cavity 120. According to one embodiment of the present disclosure, the stopper disposed along the opening of the cavity 120 may be a ring-shaped structure protruding from the bottom surface of the membrane so that the membrane may be attached to the substrate 102. The shape of the stopper is not limited thereto, the stopper may be polygon-shaped or arc-shaped disposed along the opening of the cavity 120. A first contact pad 114 and the second contact pad 116 disposed at opposite sides may be respectively electrically coupled to the electrodes of the membrane. Besides, in order to avoid undesired parasitic capacitance between the first contact pad 114 and the second contact pad 116, the sizes of the contact pads 114 and 116 may be as small as possible, but not limited thereto. According to one embodiment of the present disclosure, the first contact pad 114 and the second contact pad 116 may be disposed at the same side of the membrane 106 or at any positions as long as the contact pads 114 and 116 may be electrically coupled to the electrodes of the membrane. Additional conductive traces (not shown) electrically coupled to the first contact pad 114 and the second contact pad 116 may be disposed on the substrate 102 so as to transmit electrical signals into or out of the membrane. During the operation of the PMUT 100, the membrane may vibrate when acoustic waves exert acoustic pressure on the membrane or electrical signals are applied to the membrane. By using the stopper, the dimension and position of the membrane over the cavity 120 may be precisely defined independently of the dimension and position of the cavity 120 underneath the membrane. Accordingly, the uniformity of the resonant frequency of each PUMT 100 may be increased effectively.

Figure 2:
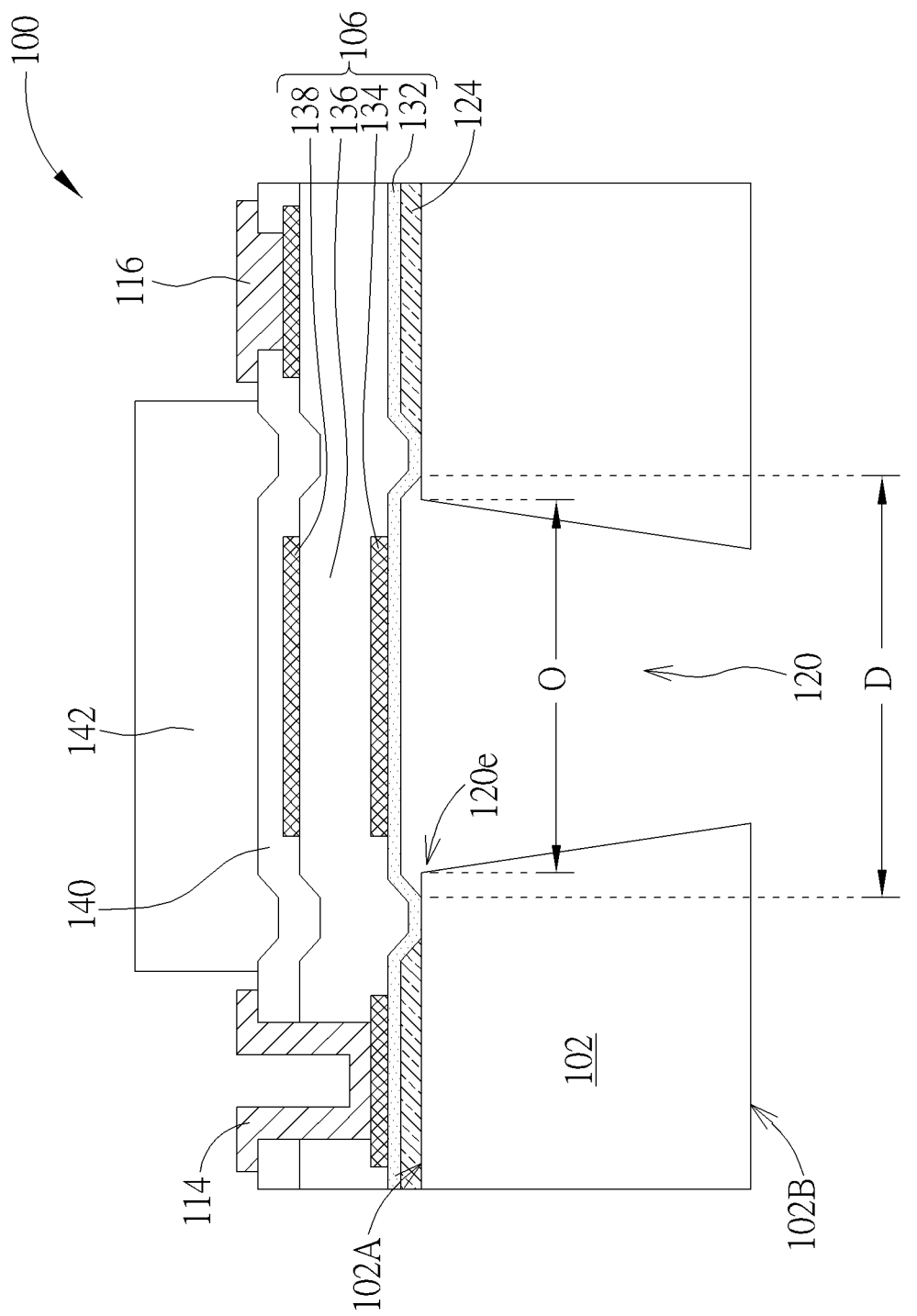
FIG. 2 is a schematic cross-sectional diagram taken along a line A-A' of FIG. 1 in accordance with one embodiment of the present disclosure.

FIG. 2 is a schematic cross-sectional diagram taken along a line A-A' of FIG. 1 in accordance with one embodiment of the present disclosure. Referring to FIG. 2, the stopper may be a portion of a first piezoelectric layer 132 anchored to the substrate 102 and in direct contact with the cavity 120, which may be called an "anchor portion" of the first piezoelectric layer 132. The opening O of the cavity 120 on at the top surface 102A of the substrate 102 may be regarded as being sealed by the first piezoelectric layer 132. The substrate 102 may be a semiconductor substrate, such as a bulk silicon substrate, but not limited thereto. The substrate 102 may be single-crystalline silicon, poly silicon, amorphous silicon, glass, ceramic material, or other suitable material. According to one embodiment of the present disclosure, the substrate 102 may be SOI substrate. A sacrificial layer 124 may be disposed between the substrate 102 and the first piezoelectric layer 132, and a composition of the sacrificial layer 124 may be different from the compositions of the substrate 102 and the first piezoelectric layer 132. According to one embodiment of the present disclosure, the sacrificial layer 124 may be a dielectric layer, such as silicon oxide ($SiO_x$) or silicon dioxide ($SiO_2$), in a case where the substrate 102 is composed of semiconductor material, such as Si. Moreover, according to another embodiment of the present disclosure, most of the sacrificial layer 124 may be omitted so that the contact region between the first piezoelectric layer 132 and the substrate 102 may be increased. A membrane 106, such as a multi-layered structure including a bottom electrode 134, a second piezoelectric layer 136, and a top electrode 138 may be disposed on the first piezoelectric layer 132. Portions of the membrane 106 may be disposed over a cavity 120 having an edge 120e in proximity to the membrane 106. According to one embodiment of the present disclosure, a vertical projection of the sacrificial layer 124 may not overlap a vertical projection of the membrane 106 disposed over the cavity. The bottom electrode 134 and the top electrode 138 of the PMUT 100 may be respectively electrically coupled to the first contact pad 114 and the second contact pad 116. An optional a passivation layer 140 composed of dielectric layer may be further disposed on the membrane 106. The elastic layer with required elasticity may be disposed on the optional passivation layer 140 so that the membrane 106 may vibrate at the certain frequency when acoustic waves or electrical signals are applied to the PMUT 100. It should be noted that the mechanical behavior of the membrane 106 is mainly dominated by the elastic layer 142 because the elasticity of the elastic layer 142 is higher than that of the layers underlying the elastic layer 142.

In order to enable one of ordinary skill in the art to implement the present disclosure, a method of fabricating a PMUT is further described below. Besides, as a PMUT may be fabricated by standard CMOS processes, associated electronics, such as FET, amplifiers, and integrated circuits, may also be fabricated on the same substrate of the PMUT by the same CMOS process.

Figure 3:
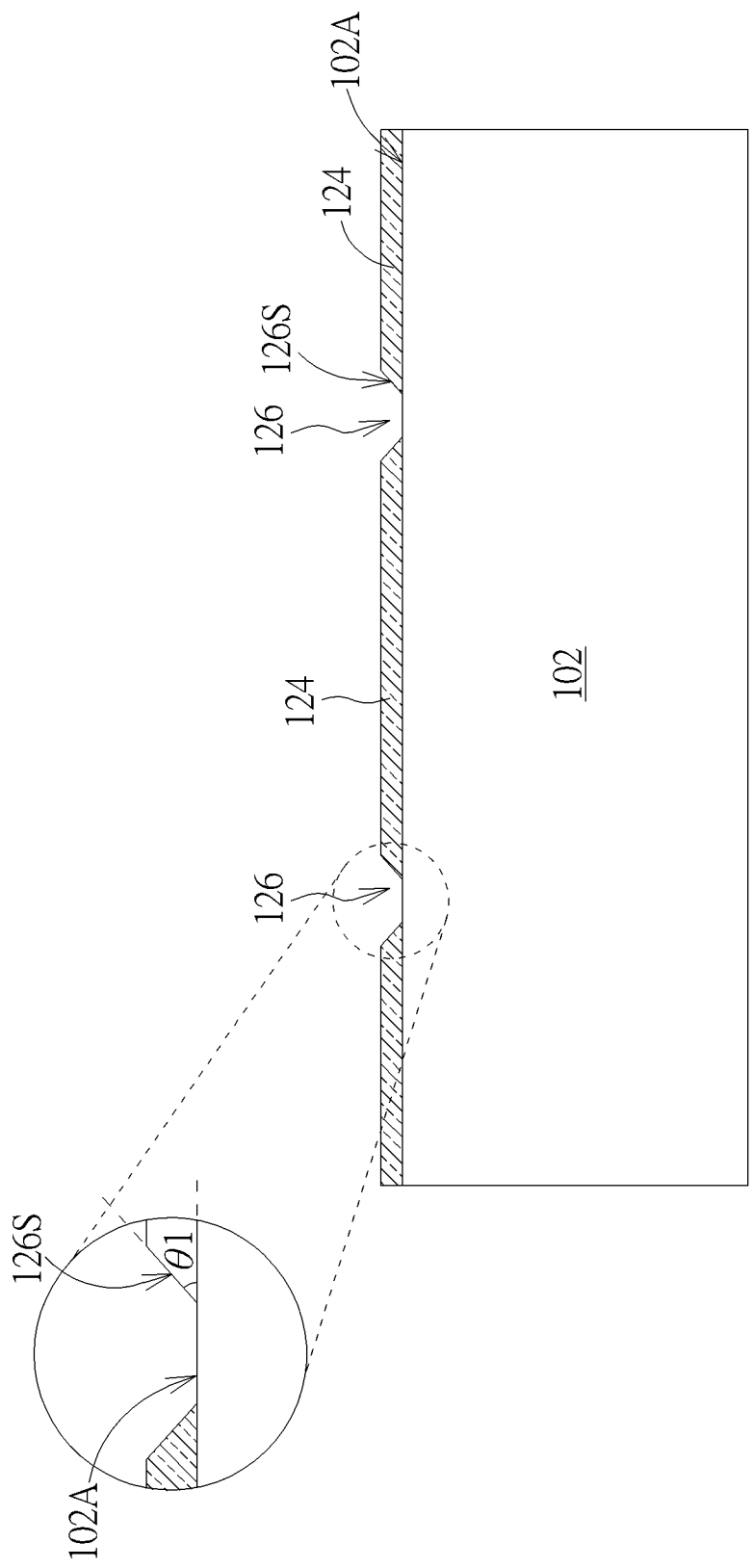
FIG. 3 is a schematic cross-sectional diagram after a sacrificial layer is formed on a substrate in accordance with one embodiment of the present disclosure.
Figure 4:
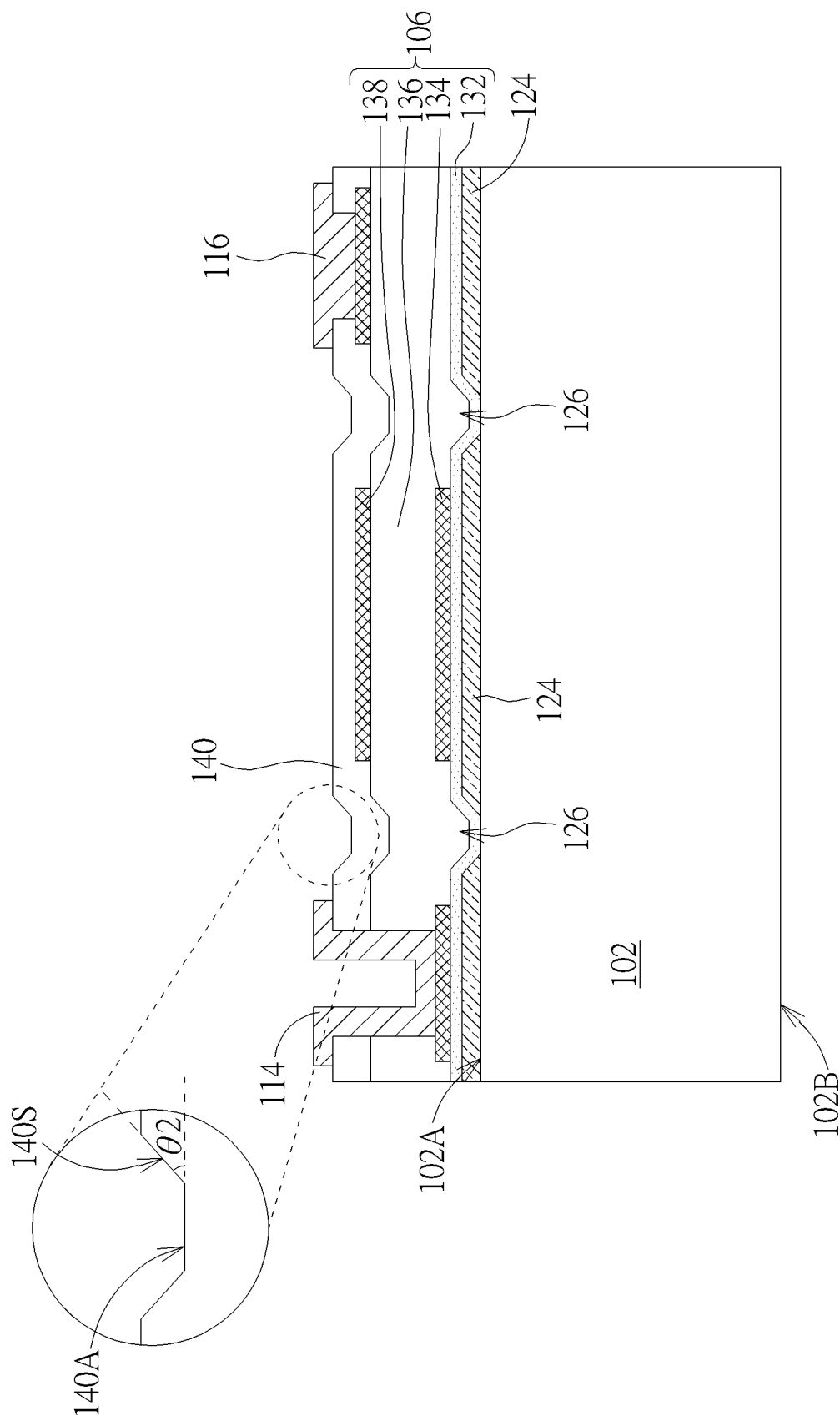
FIG. 4 is a schematic cross-sectional diagram after a membrane is formed on a substrate.
Figure 7:
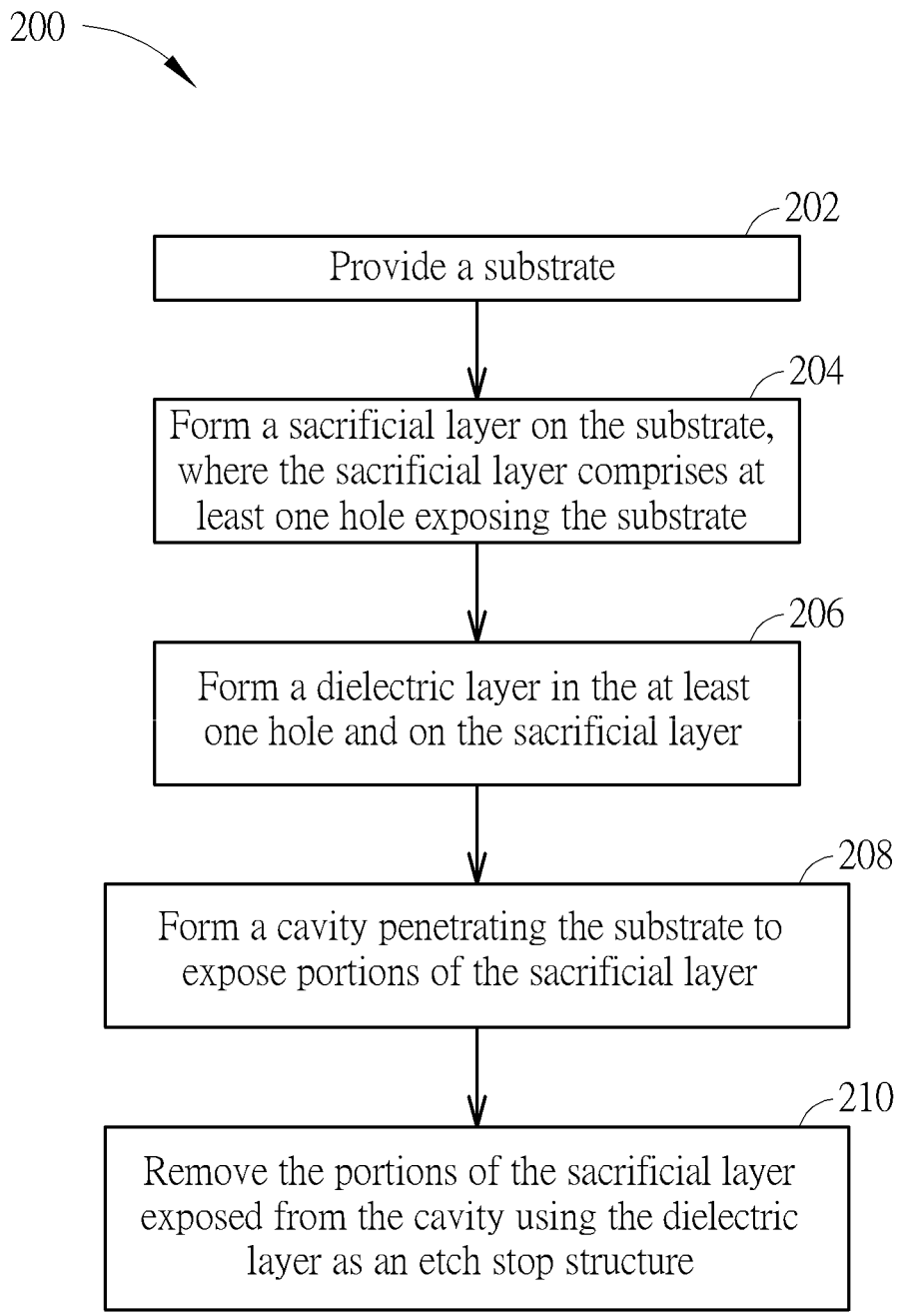
FIG. 7 is a flow chart illustrating a method of fabricating a PMUT in accordance with one embodiment of the present disclosure.

FIG. 3 is a schematic cross-sectional diagram after a sacrificial layer is formed on a substrate in accordance with one embodiment of the present disclosure. FIG. 7 is a flow chart illustrating a method of fabricating a PMUT in accordance with one embodiment of the present disclosure. Referring to FIG. 4, in steps 202 of a method 200, a substrate 102 is provided, and the substrate 102 may be chosen from semiconductor substrates or insulating substrates depending on different requirements. According to one embodiment of the present disclosure, the substrate 102 may be a single-crystalline silicon substrate. Then, in step 204, a sacrificial layer 124 is deposited on the top surface 102A of the substrate 102. There may be at least two holes 126 in the sacrificial layer 124 so that portions of the substrate 102 may be exposed from the bottom of the holes 126. Because the locations of the holes 126 may be accurately defined by the photolithography, the distance D between two holes 126 may be precisely controlled. It should be noted that, in order to increase the electrical performance or crystallinity of the layers deposited on the sacrificial layer 124 in the following processes, the angle θ1 between the sidewall of the sacrificial layer 124 and the top surface 102A of the substrate 102 should be set within a range of 10°-40°, such as 10°, 20°, 30°, or 40°, but not limited thereto.

FIG. 4 is a schematic cross-sectional diagram after a membrane is formed on a substrate. In step 206, a first piezoelectric layer 132 may be deposited on the substrate 102 and filled into the holes 126 of the sacrificial layer 124. The first piezoelectric layer 132 may be made of insulating material, such as, aluminum nitride (AlN), scandium doped aluminum nitride (AlScN), lead zirconate titanate (PZT), zinc oxide (ZnO), polyvinylidene fluoride (PVDF), lead magnesium niobate-lead titanate (PMN-PT), but not limited thereto. According to one embodiment of the present disclosure, the first piezoelectric layer 132 may also function as a seed layer for the layers subsequently deposited on the first piezoelectric layer 132. In addition, the surface texture of the first piezoelectric layer 132 may affect the crystallinity of the layers deposited thereon. Afterward, the bottom electrode 134, the second piezoelectric layer 136, the top electrode 138, and the passivation layer 140 may be sequentially deposited on the first piezoelectric layer 132. The bottom electrode 134 and the top electrode 138 may be the same or different material composed of molybdenum (Mo), titanium (Ti), aluminum (Al), or platinum (Pt), but not limited thereto. The second piezoelectric layer 136 may be composed of aluminum nitride (AlN), scandium doped aluminum nitride (AlScN), lead zirconate titanate (PZT), zinc oxide (ZnO), polyvinylidene fluoride (PVDF), lead magnesium niobate-lead titanate (PMN-PT), but not limited thereto. The passivation layer 140 may be an optional layer made of insulating material, such as $SiO_2$, SiON, or AlN, but not limited thereto. Besides, the material of the second piezoelectric layer 136 may be the same as the material of the first piezoelectric layer 132. Furthermore, recesses may be formed on the surface of the passivation layer 140, and each recess may has an angle θ2 of 5°-35° between the sidewall of the protection layer 140S and the top surface 140A of the protection layer 140S. Contact holes may be formed in the membrane 106 to respectively expose the bottom electrode 134 and the top electrode 138, and then contact pads, i.e. a first contact pad 114 and a second contact pad 116, may be filled into each contact hole. In this way, the first contact pad 114 may be electrically coupled to the bottom electrode 134, and the second contact pad 116 may be electrically coupled to the top electrode 138.

Figure 5:
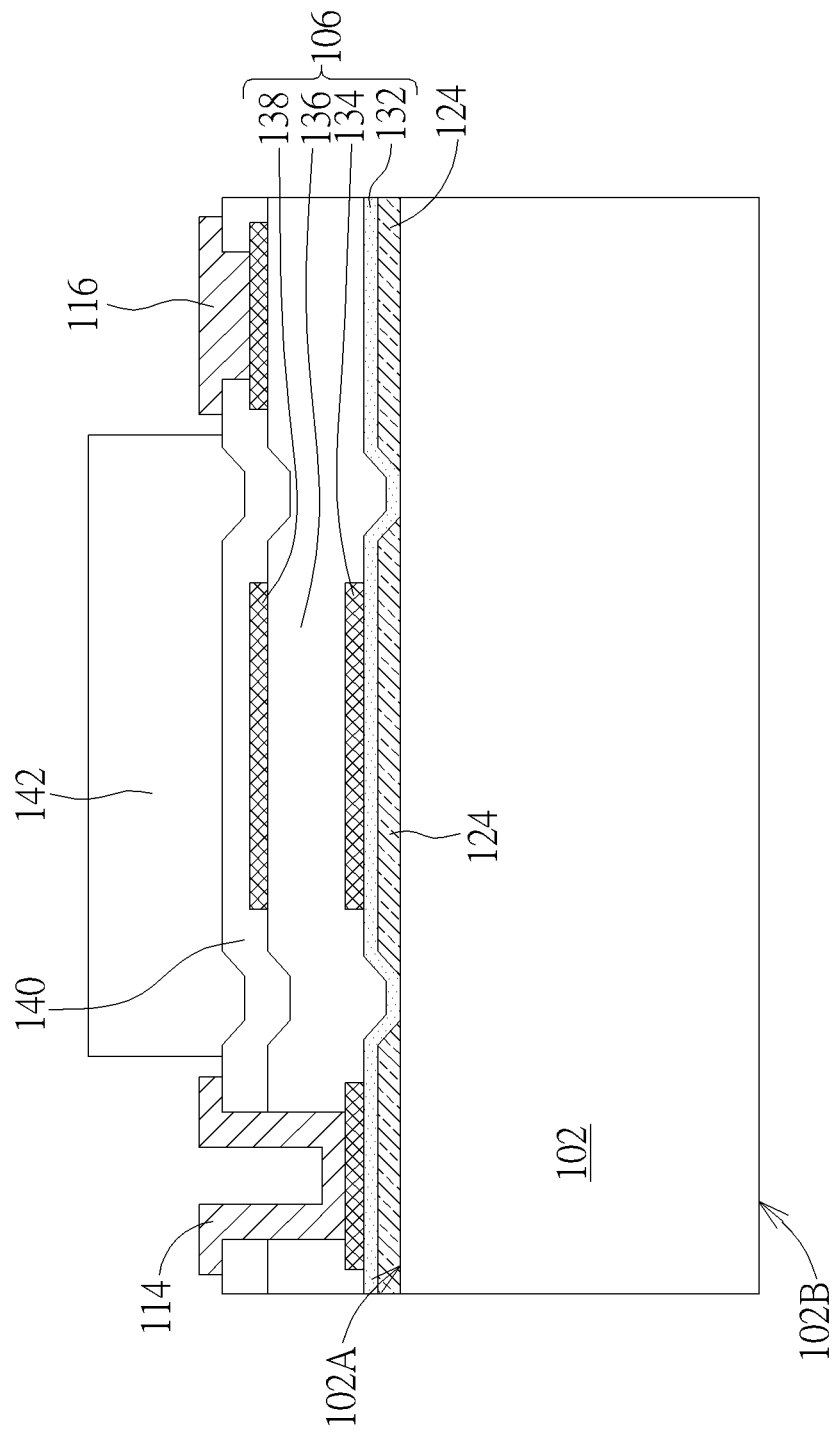
FIG. 5 is a schematic cross-sectional diagram after an elastic layer is formed on a membrane.

FIG. 5 is a schematic cross-sectional diagram after an elastic layer is formed on a membrane. Referring to FIG. 5, a layer with required elasticity may be deposited on the membrane 106 and then patterned to form an elastic layer 142 spaced apart from the conduct pads 114 and 116. The elastic layer 142 may be composed of material with suitable elasticity, such as silicon (c-Si), amorphous silicon (a-Si), silicon-rich nitride (SiNx), silicon carbide (SiC), molybdenum (Mo), titanium (Ti), aluminum (Al), or platinum (Pt), but not limited thereto. Since the elastic layer 142 is not disposed under the second piezoelectric layer 136, the crystallinity of the second piezoelectric layer 136 would no longer be affected by the surface texture of the elastic layer 142.

Figure 6:
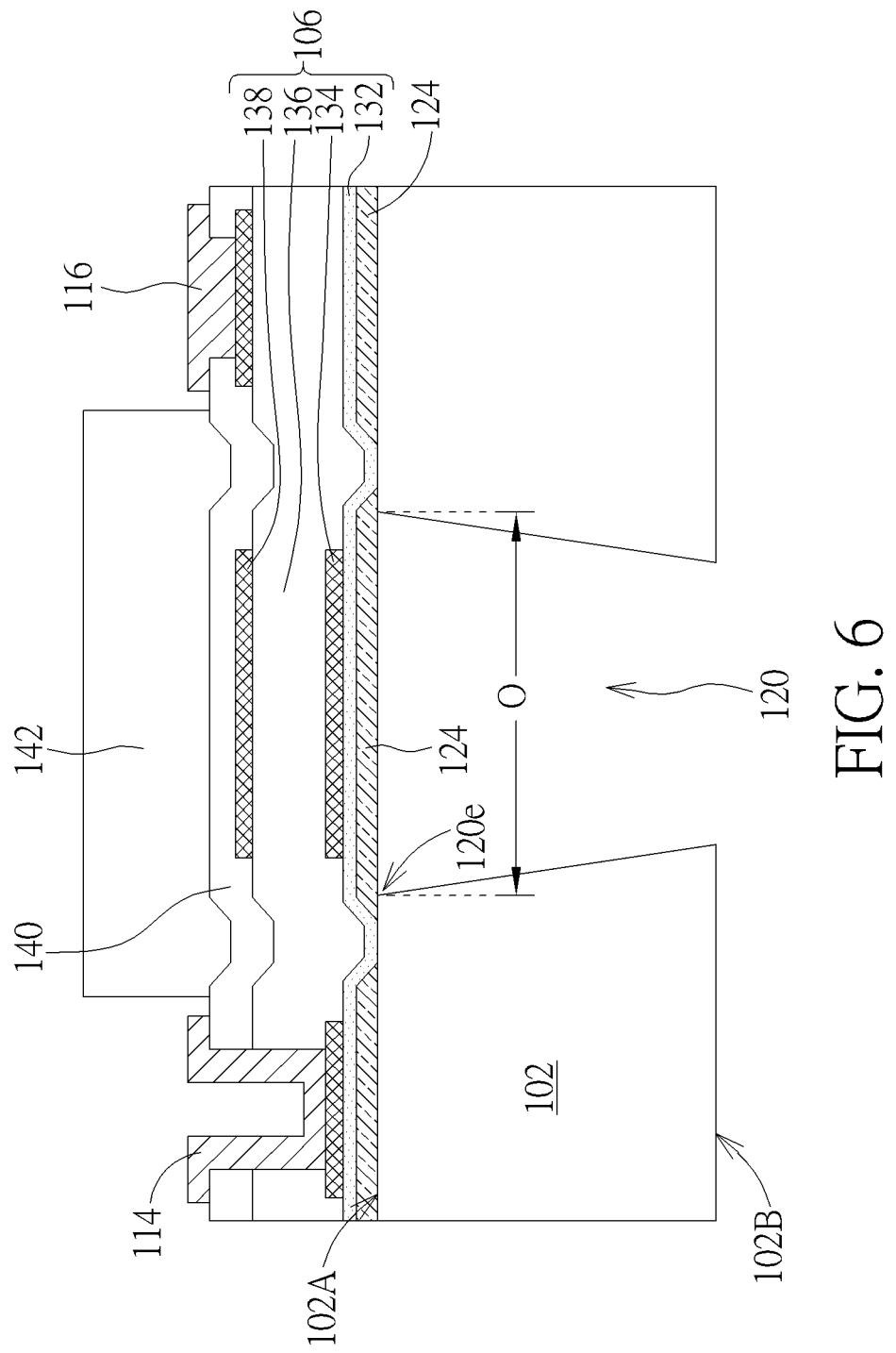
FIG. 6 is a schematic cross-sectional diagram after a cavity penetrating a substrate is formed in accordance with one embodiment of the present disclosure.

FIG. 6 is a schematic cross-sectional diagram after a cavity penetrating a substrate is formed in accordance with one embodiment of the present disclosure. Referring to FIG. 6, in step 208, a cavity 120 penetrating the substrate 102 may be formed by etching the backside of the substrate 102. Thus, the bottom of the sacrificial 124 layer may be partially exposed from the cavity 120. The cavity 120 may have an opening O defined by the edge 120e of the cavity 120 in proximity to the membrane 106 on the front-side of the substrate 102, and the length defined by the opening O may be less than the distance D defined by the anchored points of the first piezoelectric layer 132. Since the distance D used to define the position of the membrane of the PMUT is mainly determined by the anchored points of the first piezoelectric layer 132, the position and dimension of the membrane of the PMUT may still not change even if there is a slight shift in the position or dimension of the opening O.

Afterwards, in step 210, an etching process may be conducted to remove the sacrificial layer 124 exposed from the cavity 120 by using the first piezoelectric layer 132 as an etch stop layer. The etchants may be vapor fluoric acid (VHF) when the sacrificial layer 124 is made of silicon oxide. Since an etch selectivity of the sacrificial layer 124 to the first piezoelectric layer 132 is greater than 10 during the step of removing the sacrificial layer 124 exposed from the cavity 120, only the sacrificial layer 124 in direct contact with may be removed. Besides, because the etchants are prevented by the anchored points of the first piezoelectric layer 132 from reaching the rest of the sacrificial layer 124, the rest of the sacrificial layer may not be removed during the etching process. As a result, a structure of FIG. 2 may be obtained.

According to the embodiments of the present disclosure, the elastic layer is not disposed between the substrate and the membrane, but disposed on the top surface of the membrane. Therefore, the crystallinity of the piezoelectric layer in the membrane would no longer be affected by the surface texture of the elastic layer, which allows the free adjustment to the total elasticity of the membrane of the PMUT.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A piezoelectric micromachined ultrasonic transducer (PMUT), comprising:
   a substrate having a cavity penetrating the substrate;
   a membrane disposed over the cavity, the membrane comprising:
      a first piezoelectric layer disposed over the cavity, the first piezoelectric layer comprising an anchor portion, wherein the anchor portion of the first piezoelectric layer is in direct contact with the substrate;
      a bottom electrode disposed over the first piezoelectric layer;
      a top electrode disposed over the bottom electrode; and
      a second piezoelectric layer disposed between the bottom electrode and the top electrode; and
   a sacrificial layer disposed between the substrate and the first piezoelectric layer, wherein a vertical projection of the sacrificial layer is not overlapped with a vertical projection of portions of the membrane disposed over the cavity.

2. The PMUT of claim 1, wherein an opening of the cavity is in proximity to the membrane.

3. The PMUT of claim 1, wherein the anchor portion of the first piezoelectric layer in direct contact with the substrate is a ring-shaped, polygon-shaped, or arc-shaped structure disposed along an opening of the cavity.

4. The PMUT of claim 1, further comprising an interface between one end of the sacrificial layer and the first piezoelectric layer, wherein an angle between the interface and a top surface of the substrate is 10°-40°.

5. The PMUT of claim 1, wherein the etch selectivity of sacrificial layer to the dielectric layer is greater than 10 when vapor fluoric acid (VHF) is used as etchant.

6. The PMUT of claim 5, wherein a material of the first piezoelectric layer is the same as a material of the second piezoelectric layer.

7. The PMUT of claim 6, wherein the dielectric layer is in direct contact with the bottom electrode.

8. The PMUT of claim 5, further comprising an elastic layer disposed on the membrane.

9. The PMUT of claim 8, further comprising at least one contact pad disposed over the sacrificial layer, wherein the elastic layer is spaced apart from the contact pad.

10. The PMUT of claim 8, further comprising a passivation layer disposed between the membrane and the elastic layer.

* * * * *